US012791954B2

(12) United States Patent
Han et al.

(10) Patent No.: US 12,791,954 B2
(45) Date of Patent: Nov. 10, 2026

(54) SUBSTRATE PROCESSING APPARATUS, SUBSTRATE PROCESSING SYSTEM, AND SUBSTRATE PROCESSING METHOD

(71) Applicant: SAMSUNG ELECTRONICS CO., LTD., Suwon-si (KR)

(72) Inventors: Kyuhee Han, Suwon-si (KR); Koungmin Ryu, Suwon-si (KR); Kyeongbeom Park, Suwon-si (KR); Jongmin Baek, Suwon-si (KR); Wookyung You, Suwon-si (KR); Woojin Lee, Suwon-si (KR); Juhee Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 243 days.

(21) Appl. No.: 18/230,472

(22) Filed: Aug. 4, 2023

(65) Prior Publication Data

US 2024/0085812 A1 Mar. 14, 2024

(30) Foreign Application Priority Data

Sep. 13, 2022 (KR) ........................ 10-2022-0115223

(51) Int. Cl.

*G03F 7/00* (2006.01)
*G03F 7/20* (2006.01)
(Continued)

(52) U.S. Cl.

CPC ........ *G03F 7/70925* (2013.01); *G03F 7/2004* (2013.01); *G03F 7/40* (2013.01); *H10P 76/40* (2026.01)

(58) Field of Classification Search

CPC ...... G03F 7/2004; G03F 7/40; G03F 7/70925; H01L 21/033; H01L 21/0273;
(Continued)

(56) References Cited

U.S. PATENT DOCUMENTS 6,943,124 B1 9/2005 Lu et al.
9,996,004 B2 6/2018 Smith et al.
(Continued)

FOREIGN PATENT DOCUMENTS

KR 10-2008-0022879 A 3/2008
KR 10-2013-0135708 A 12/2013
(Continued)

OTHER PUBLICATIONS

Communication issued Jul. 22, 2026 by the Korean Ministry of Intellectual Property in Korean Patent Application No. 10-2022-0115223.

*Primary Examiner* — Deoram Persaud
(74) *Attorney, Agent, or Firm* — Sughrue Mion, PLLC

(57) ABSTRACT

A substrate processing apparatus includes a chamber having an internal space configured to process a substrate loaded therein; a light source configured to emit light on the substrate to harden a photoresist pattern coated on the substrate; and a transparent division part provided between the substrate and the light source, wherein the transparent division part divides the chamber into a first space, in which the light source is provided, and a second space, in which the substrate is provided.

7 Claims, 16 Drawing Sheets

(51) Int. Cl.

| | |
|---|---|
| ***G03F 7/40*** | (2006.01) |
| ***H10P 76/40*** | (2026.01) |

(58) Field of Classification Search

CPC ............. G06F 12/0871; G06F 12/1009; G06F 2212/7202; G06F 3/0658; G06F 3/0659; G06F 8/441

See application file for complete search history.

(56) References Cited

U.S. PATENT DOCUMENTS

| | | | | |
|---|---|---|---|---|
| 10,804,106 | B2 | 10/2020 | Ebrish et al. | |
| 11,644,748 | B2 * | 5/2023 | Wu | G03F 1/82 430/5 |
| 2004/0221876 | A1 * | 11/2004 | Waleh | B08B 7/00 134/1 |
| 2005/0078953 | A1 * | 4/2005 | Fodor | C23C 16/4585 392/418 |
| 2018/0093306 | A1 * | 4/2018 | Kang | B08B 7/0021 |
| 2019/0384178 | A1 | 12/2019 | Yang | |
| 2020/0133133 | A1 | 4/2020 | Park et al. | |
| 2021/0063883 | A1 * | 3/2021 | Tanaka | G03F 7/2002 |
| 2021/0110997 | A1 * | 4/2021 | Shin | H01J 37/063 |
| 2022/0093369 | A1 * | 3/2022 | Lee | H01J 37/32541 |
| 2022/0148879 | A1 | 5/2022 | Xia et al. | |
| 2023/0416606 | A1 * | 12/2023 | Dictus | C09K 13/08 |
| 2024/0329538 | A1 * | 10/2024 | Li | G03F 7/0042 |
| 2024/0355650 | A1 * | 10/2024 | Kanakasabapathy | G03F 7/36 |
| 2025/0060673 | A1 * | 2/2025 | Wu | G03F 7/0042 |

FOREIGN PATENT DOCUMENTS

| | | | |
|---|---|---|---|
| KR | 10-2022-0064438 | A | 5/2022 |
| WO | 2022/125388 | A1 | 6/2022 |

* cited by examiner

SUBSTRATE PROCESSING APPARATUS, SUBSTRATE PROCESSING SYSTEM, AND SUBSTRATE PROCESSING METHOD

CROSS-REFERENCE TO RELATED APPLICATION

This application is based on and claims priority under 35 U.S.C. § 119 to Korean Patent Application No. 10-2022-0115223, filed on Sep. 13, 2022, in the Korean Intellectual Property Office, the disclosure of which is incorporated by reference herein in its entirety.

BACKGROUND

The present disclosure relates to a substrate processing apparatus, a substrate processing system, and a substrate processing method.

Recently, along with a decrease in a memory cell size for high integration of information communication devices, operation circuits for an operation of a semiconductor device and wiring structures for electrical connections of the semiconductor device have become more complicated. Accordingly, the application of an extreme ultraviolet (EUV) lithography process in semiconductor device manufacturing has increased. EUV lithography is a lithography technique using light of a wavelength in a range of, for example, about 4 nm to about 124 nm, or, for example, a wavelength of about 13.5 nm. EUV lithography enables ultra fine dimension processing of 20 nm or less (sub-20 nm), which is difficult to implement with an existing lithography technique using an argon fluoride (ArF) excimer laser beam. However, because the number of photons per EUV patterning area is reduced to 1/14 of the number of photons per deep ultraviolet (DUV) patterning area, EUV lithography is vulnerable to a patterning defect due to a random distribution of photons.

SUMMARY

One or more example embodiments provide a photoresist pattern which improves reliability and stability by removing residue in a semiconductor process.

In addition, the problems addressed by embodiments of the present disclosure are not limited to the problem(s) mentioned above, and one or more embodiments may address problems other than those mentioned above.

According to an aspect of an example embodiment, a substrate processing apparatus includes: a chamber having an internal space configured to process a substrate loaded therein; a light source configured to emit light on the substrate to harden a photoresist pattern coated on the substrate; and a transparent division part provided between the substrate and the light source, wherein the transparent division part divides the chamber into a first space, in which the light source is provided, and a second space, in which the substrate is provided.

According to an aspect of an example embodiment, a substrate processing system including: a first process chamber configured to perform a deposition process of coating a photoresist layer on a substrate; a second process chamber configured to perform a process of forming a photoresist pattern from the photoresist layer by supplying a developer onto the substrate on which the deposition process and an exposure process have been performed, and perform a development process on the substrate; a third process chamber configured to perform a cleaning process of removing residue on the substrate on which the development process has been performed; and a fourth process chamber configured to perform a hardening process of hardening the substrate on which the cleaning process has been performed, wherein the photoresist pattern includes a metal oxide and an organic material, and the hardening process includes removing the organic material in the photoresist pattern.

According to an aspect of an example embodiment, a substrate processing method including: performing a deposition process of coating a photoresist layer on a substrate; forming a photoresist pattern by supplying a developer onto the substrate on which the deposition process and an exposure process have been performed, and performing a development process; performing a cleaning process of removing residue on the substrate on which the development process has been performed; and performing a hardening process of hardening the substrate on which the cleaning process has been performed, wherein, before the hardening process, the photoresist pattern includes a metal oxide and an organic material, and the hardening process includes removing the organic material in the photoresist pattern.

BRIEF DESCRIPTION OF THE DRAWINGS

The above and other aspects and features will be more apparent from the following detailed description of example embodiments taken in conjunction with the accompanying drawings, in which.

DETAILED DESCRIPTION

Figure 1:
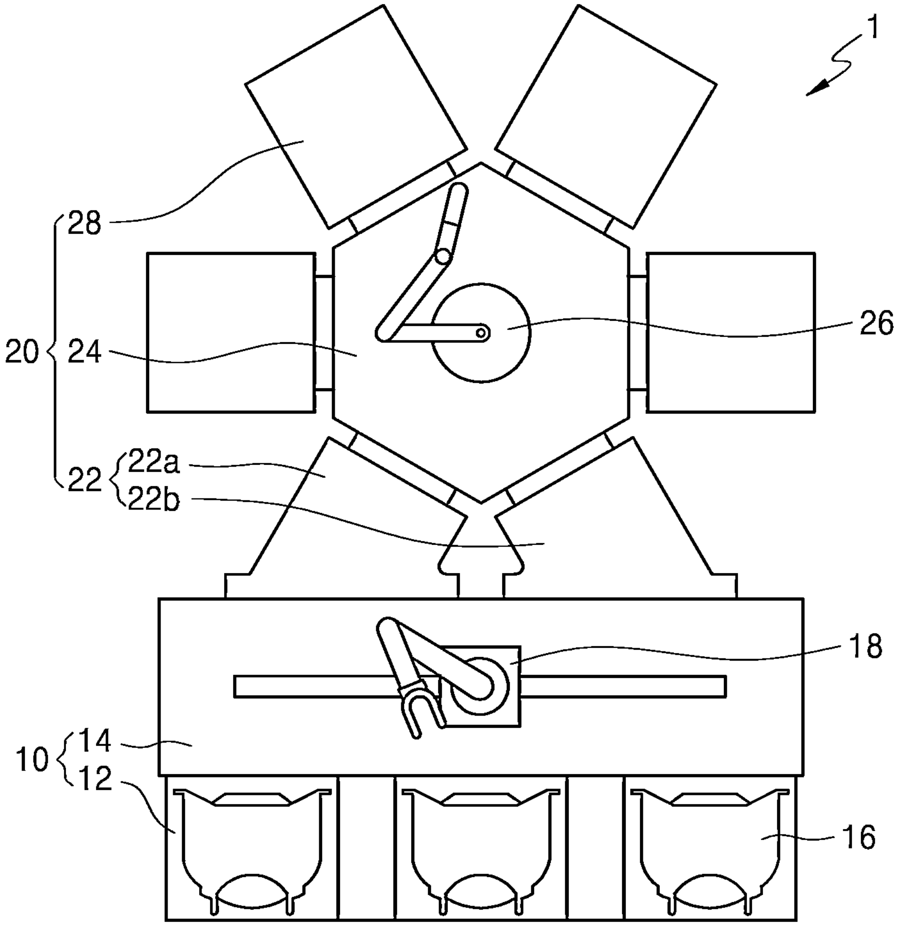
FIG. 1 is a top view schematically illustrating a substrate processing system according to one or more example embodiments.

Hereinafter, example embodiments are described in detail with reference to the accompanying drawings. Like reference numerals in the drawings denote like elements, and thus their repetitive description is omitted.

FIG. 1 is a top view schematically illustrating a substrate processing system 1 according to one or more example embodiments.

Referring to FIG. 1, the substrate processing system 1 may include an equipment front end module 10 and process equipment 20. The equipment front end module 10 may be mounted on the front of the process equipment 20. The equipment front end module 10 may transport a substrate between a container 16 in which substrates are accommodated and the process equipment 20. The equipment front end module 10 may include a plurality of loadports 12 and a frame 14. The frame 14 may be between the plurality of loadports 12 and the process equipment 20.

The container 16, in which substrates are accommodated, may be provided on one of the loadports 12 by a transportation means, including, but not limited to, an overhead transfer, an overhead conveyor, or an automatic guided vehicle. The container 16 may be a sealed container, including, but not limited to, a front open unified pod. In the frame 14, a frame robot 18 may be configured to transport a substrate between the container 16 on the one of the loadports 12 and the process equipment 20. The frame 14 may comprise a door opener configured to automatically open and close a door of the container 16. In addition, the frame 14 may include a fan filter unit configured to supply clean air to the inside of the frame 14 so that the clean air flows from an upper part to a lower part of the frame 14.

The process equipment 20 may include loadlock chambers 22, a transfer chamber 24, and a process chamber 28. The transfer chamber 24 has a generally polygonal shape when shown in a top view. The loadlock chambers 22 or the process chamber 28 may be provided at a side surface of the transfer chamber 24.

The loadlock chambers 22 may be between the transfer chamber 24 and the equipment front end module 10. At least one of the loadlock chambers 22 may be provided. In one or more example embodiments, two or more loadlock chambers 22 may be provided. Substrates to be loaded to the process equipment 20 to perform a process on the substrates may be accommodated in a first loadlock chamber **22*a* of the two loadlock chambers 22. Substrates unloaded from the process equipment 20 after finishing a process on the substrates may be accommodated in a second loadlock chamber 22*b* of the two loadlock chambers 22. Alternatively, one or more loadlock chambers 22 may be provided, and a substrate may be loaded to, or unloaded from, each of the loadlock chambers 22**.

A transportation robot 26 may be mounted on the transfer chamber 24. The transportation robot 26 may load a substrate S (see FIG. 2) to the process chamber 28 or may unload the substrate S from the process chamber 28. In addition, the transportation robot 26 may transport the substrate S between the process chamber 28 and the loadlock chambers 22.

The insides of the transfer chamber 24 and the process chamber 28 may be adjusted to a vacuum, and the inside of the loadlock chambers 22 may switch between a vacuum and atmospheric pressure. The loadlock chambers 22 may prevent external pollutants from being introduced to the transfer chamber 24 and the process chamber 28. A gate valve may be between the loadlock chambers 22 and the transfer chamber 24 and/or may be between the loadlock chambers 22 and the equipment front end module 10. Such agate valve may open and close at a position between the loadlock chambers 22 and the transfer chamber 24 and at a position between the loadlock chambers 22 and the equipment front end module 10.

For example, when a substrate moves between the equipment front end module 10 and the loadlock chambers 22, the gate valve between the loadlock chambers 22 and the transfer chamber 24 may be closed. In addition, when a substrate moves between the loadlock chambers 22 and the transfer chamber 24, the gate valve between the loadlock chambers 22 and the equipment front end module 10 may be closed.

The process chamber 28 may be configured to perform a certain process on a substrate, however, one or more example embodiments are not limited to a certain process. For example, the process chamber 28 may be configured to perform a process, including, but not limited to, a deposition process, a development process, a cleaning process, or a hardening process, on a substrate. One or more process chambers 28 may be provided along sides of the transfer chamber 24. When a plurality of process chambers 28 are provided, each one of the process chambers 28 may perform the same process on a substrate, however, one or more example embodiments are not limited to the same process.

Hereinafter, one or more example embodiments of the process chamber 28 is referred to as a substrate processing apparatus 200.

Figure 2:
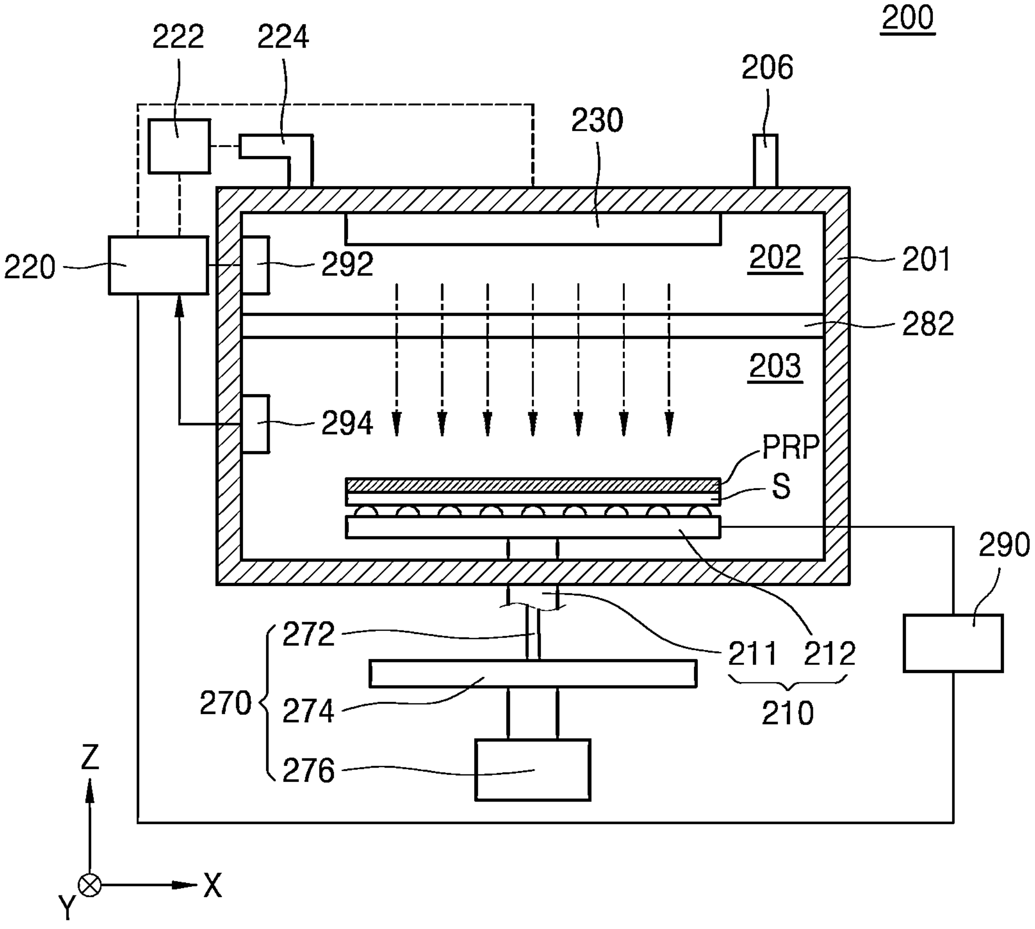
FIG. 2 is a cross-sectional view schematically illustrating an example of a substrate processing apparatus for performing a semiconductor process on a substrate, according to one or more example embodiments.

FIG. 2 is a cross-sectional view schematically illustrating an example of the substrate processing apparatus 200 for performing a semiconductor process on a substrate, according to one or more example embodiments.

Referring to FIG. 2, the substrate processing apparatus 200 may include a chamber 201, a support device 210, a gas supplier 222, a controller 220, a light source 230, and a lift pin assembly 270. According to one or more example embodiments, the substrate processing apparatus 200 may perform a hardening process on a photoresist pattern PRP coated on the substrate S. In one or more example embodiments, a process using the substrate processing apparatus 200 may be a hardening process, and hereinafter, a hardening process using light is described according to one or more example embodiments.

The chamber 201 may have a cylindrical shape having an internal space in which a process may be performed. The chamber 201 may be configured to isolate, from the outside, the internal space of the chamber 201 in which a process may be performed. In addition, an exhaust pipe 206 through which by-products generated, during a process may be discharged, may be connected to the outer surface of the chamber 201. The exhaust pipe 206 may include a pump configured to maintain process pressure inside the chamber 201 during a process and a valve configured to open and close a passage inside the exhaust pipe 206. The chamber 201 may include a transparent division part 282 between the substrate S and the light source 230.

The transparent division part 282 may divide the chamber 201 into a first space 202 and a second space 203. Light emitted from the light source 230 may transmit through the transparent division part 282. That is, the transparent division part 282 may comprise a light-transmissible transparent material. For example, the transparent division part 282 may comprise a quartz material but is not limited thereto. The first space 202 may be an upper space in the chamber 201, in which the light source 230 may be provided. The second space 203 may be a lower space in the chamber 201, in which the substrate S may be provided. The second space

203 may be adjusted to a vacuum. In addition, in a process thereafter, a reaction gas may be introduced to the second space 203.

The support device 210 may include a support plate 212 supporting the substrate S during a process. The support device 210 may have a generally disk shape. A support shaft 211 rotatable by a driver 276 may be fixedly coupled to a lower surface of the support plate 212. The substrate S may rotate during a process. The support device 210 may hold the substrate S by using a configuration, including, but not limited to, an electrostatic force or mechanical clamping.

The gas supplier 222 may supply gas to the inside of the chamber 201. The gas supplier 222 may supply the gas to the inside of the chamber 201 through a gas supply pipe 224. In particular, the gas supplier 222 may supply the gas to the first space 202. According to one or more example embodiments, the supplied gas may be inert gas. The inert gas may cool down the first space 202. A valve configured to open and close an internal passage of the gas supply pipe 242 may be provided to the gas supply pipe 224.

The controller 220 may adjust a light strength and an emission time of light to be emitted from the light source 230. In addition, the controller 220 may receive a heating temperature for the substrate S from a temperature controller 290. The controller 220 may receive a temperature of the first space 202 from a temperature sensor 292. For example, if the temperature of the first space 202 exceeds a preset reference temperature, then the controller 220 may control the gas supplier 222 to supply the gas to the first space 202.

The light source 230 may emit light on the substrate S coated with the photoresist pattern PRP. The light source 230 may emit light to harden the photoresist pattern PRP. The light source 230 may emit ultraviolet (UV) light. The light source 230 may include a plurality of lamps. The light source 230 may include any one type of lamp including, but not limited to, a halogen lamp, a mercury lamp, and a light-emitting diode (LED) lamp.

In one or more example embodiments, a wavelength of the light emitted from the light source 230 may be in a range of about 200 nm to about 800 nm. In one or more example embodiments, the wavelength of the light emitted from the light source 230 may be in a range of about 300 nm to about 700 nm.

The lift pin assembly 270 may load the substrate S to the support plate 212 or may unload the substrate S from the support plate 212. The lift pin assembly 270 may include a lift pin 272, a support plate 274, and the driver 276. The lift pin 272 may be fixedly provided to the support plate 274 and may move together with the support plate 274. The support plate 274 may have a disk shape and may be located under the support plate 212 inside the chamber 201 or outside the chamber 201. The support plate 274 may be elevated upward and downward by the driver 276, which includes, but is not limited to a hydraulic cylinder or a motor.

The substrate processing apparatus 200 may harden the photoresist pattern PRP coated on the substrate S, by using the light source 230, thereby improving a profile of the photoresist pattern PRP. Residue of the photoresist pattern PRP may be removed by a hardening process, thereby improving the precision of an etching process to be performed on the photoresist pattern PRP thereafter.

Figure 3:
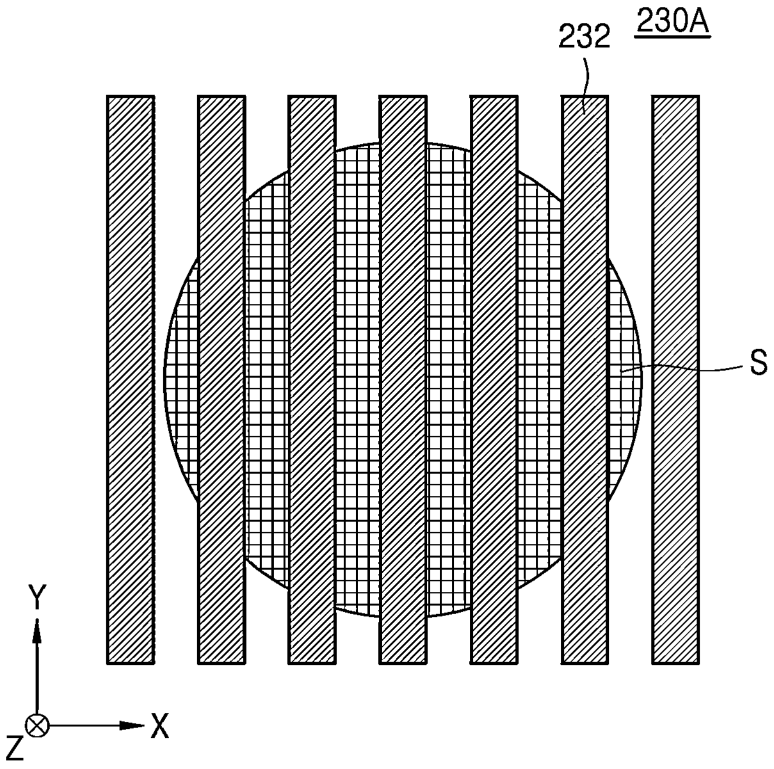
FIGS. 3, 4 and 5 illustrate light sources corresponding to a substrate, according to one or more example embodiments.
Figure 4:
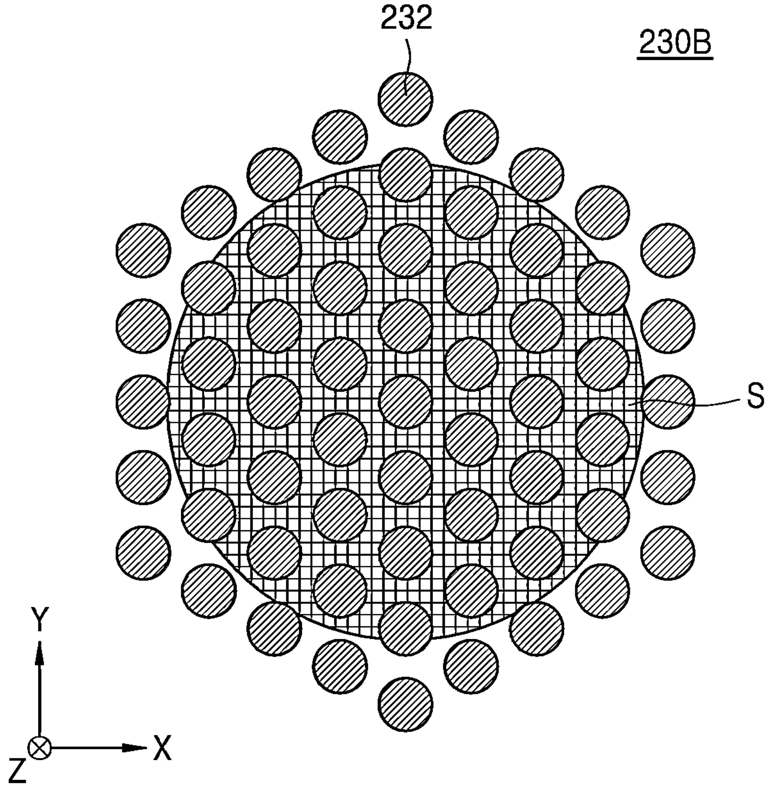
Figure 5:
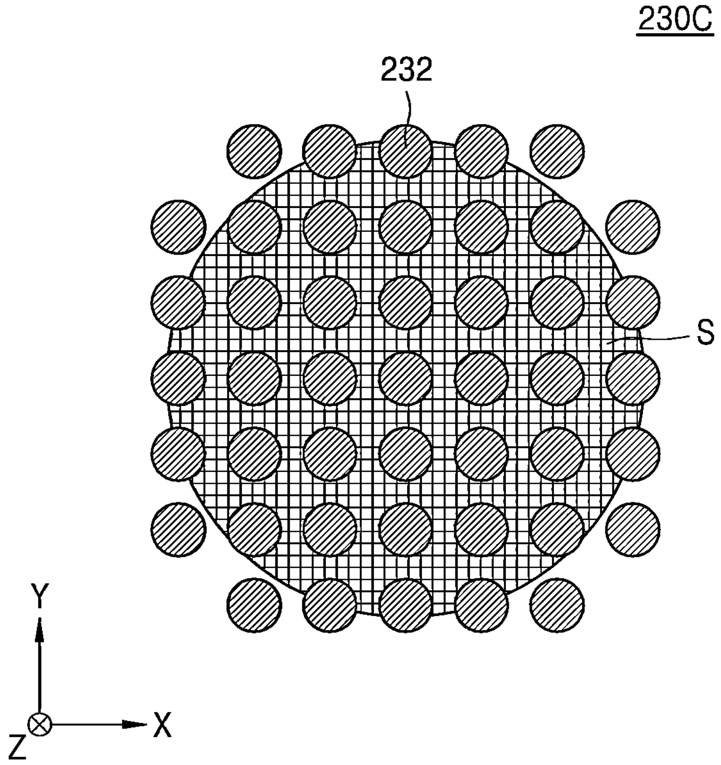

FIGS. 3, 4 and 5 illustrate light sources 230A, 230C, and 230C, respectively, corresponding to a substrate, according to one or more example embodiments.

FIG. 3 shows the light source 230A including a plurality of lamps 232, according to one or more example embodiments. FIG. 4 shows the light source 230B including the plurality of lamps 232, according to one or more example embodiments. FIG. 5 shows the light source 230C including a plurality of lamps 232, according to one or more example embodiments. The substrate S shown in FIGS. 3, 4 and 5 refers to the substrate S below the light source 230 of FIG. 2.

Referring to the one or more example embodiments shown in FIG. 3, the light source 230A may include the plurality of lamps 232, and each of the plurality of lamps 232 may have a cylindrical shape. The plurality of lamps 232 may be spaced apart by the same distance from each other. In addition, the plurality of lamps 232 may be parallel to each other in an X direction. Lamps at both ends in the X direction among the plurality of lamps 232 may fully cover both ends of the substrate S in the X direction. A length of the plurality of lamps 232 in a Y direction may be greater than a diameter of the substrate S. Accordingly, the plurality of lamps 232 may emit uniform light all over the photoresist pattern PRP on the substrate S.

Referring to one or more example embodiments shown in FIG. 4, the light source 230B may include the plurality of lamps 232, and each of the plurality of lamps 232 may have a circular shape. The plurality of lamps 232 may be spaced apart from each other by the same distance. The plurality of lamps 232 may have a hexagonal arrangement, and the periphery of the plurality of lamps 232 may have a hexagonal shape. The plurality of lamps 232 may emit uniform light on the substrate S.

Referring to FIG. 5, the light source 230C may include a plurality of lamps 232, and each of the plurality of lamps 232 may have a circular shape. The plurality of lamps 232 may be provided in a matrix form in the X direction and the Y direction and spaced apart from each other by the same distance in the X direction and in the Y direction. In addition, the periphery of the plurality of lamps 232 may have a shape similar to a rectangle, that is, a polygonal shape with corners having no lamps. The plurality of lamps 232 may emit uniform light on the substrate S. An arrangement shape of the plurality of lamps 232 is not limited to the described one or more example embodiments and one or more example embodiments may be any one of, but not limited to, a circular shape, a square shape, a rectangular shape, and a polygonal shape.

Figure 6:
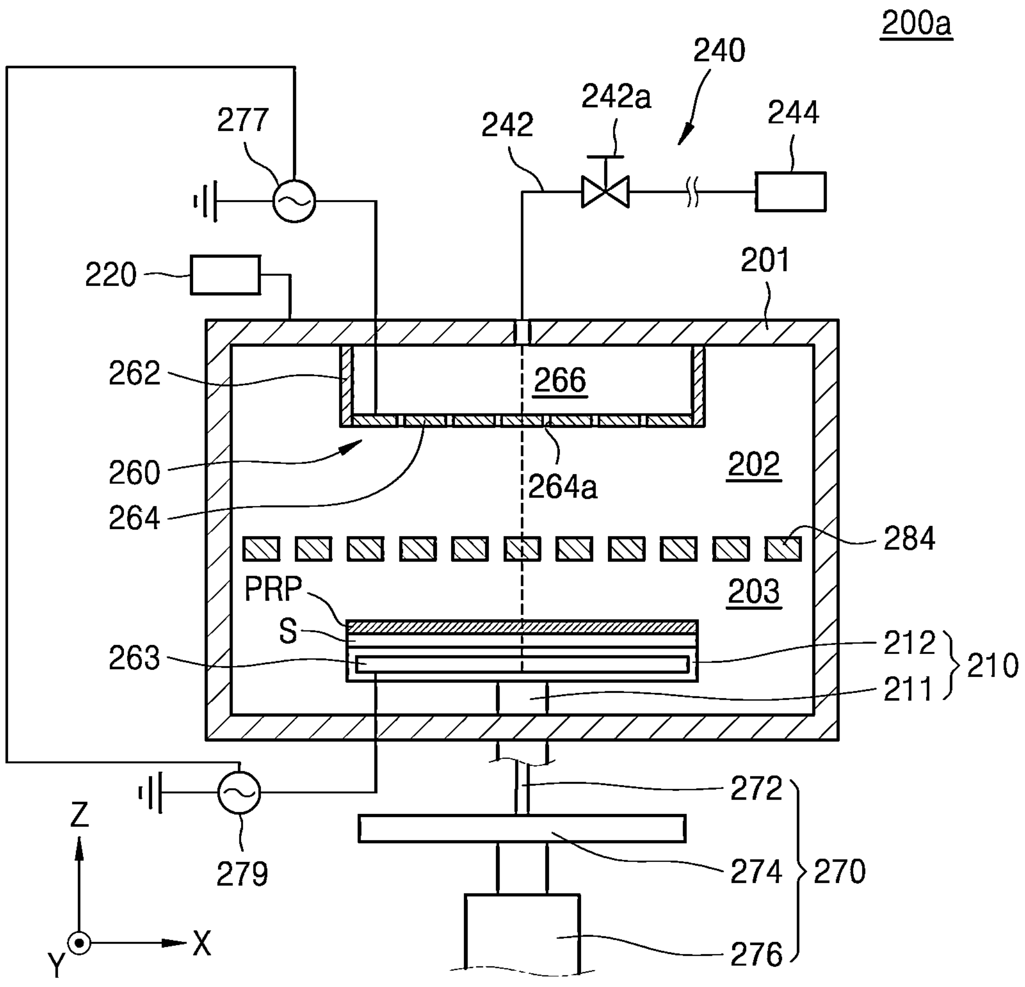
FIG. 6 is a cross-sectional view schematically illustrating an example of a substrate processing apparatus for performing a semiconductor process on a substrate, according to one or more example embodiments.

FIG. 6 is a cross-sectional view schematically illustrating an example of a substrate processing apparatus 200*a* for performing a semiconductor process on the substrate S, according to one or more example embodiments.

Referring to FIG. 6, the substrate processing apparatus 200*a* according to one or more example embodiments may have a similar structure to that of one or more example embodiments shown in FIG. 2, except for an additional structure for forming plasma. A description of components of one or more example embodiments may refer to a description of the same or similar components of the substrate processing apparatus 200 of the one or more example embodiments shown in FIG. 2. In one or more example embodiments, a plasma processing apparatus, using the substrate S as an example of a plasma processing target, and capacitively coupling plasma (CCP) as a plasma source, is described as one or more example embodiments.

The substrate processing apparatus 200*a* may include a gas supply member 240, a filter part 284, a shower head 260, a spray plate 264, a lower electrode 263, and a first power supplier 277. In one or more example embodiments, a process using the substrate processing apparatus 200*a* may be a hardening process, and hereinafter, a hardening process using plasma is described as one or more example embodiments.

The gas supply member 240 may supply process gas to the inside of the chamber 201. The gas supply member 240 may include a gas supply pipe 242 connecting a gas supply source 244 to the chamber 201. A valve 242*a* configured to open and close an internal passage of the gas supply pipe 242 may be provided to the gas supply pipe 242.

The filter part 284 may filter plasma generated in the first space 202 of the chamber 201. The filter part 284 may selectively pass therethrough only radicals, by blocking ions of the plasma. The radicals may pass through the filter part 284 and move from the first space 202 to the second space 203. The radicals having passed through the filter part 284 may harden the photoresist pattern PRP coated on the substrate S.

The shower head 260 may uniformly spread, to the first space 202, the process gas introduced to the inside of the chamber 201. The shower head 260 may be at an upper part of the chamber 201 to face the support device 210. The shower head 260 may include an annular side wall 262 and a spray plate 264 that may be shaped as a disk. The side wall 262 of the shower head 260 may be fixedly coupled to the chamber 201 to protrude downward from an upper wall of the chamber 201.

A plurality of spray holes 264*a* may be formed in the entire area of the spray plate 264. The process gas may be introduced to a space 266 provided by the chamber 201 and the shower head 260 and then sprayed through the plurality of spray holes 264*a*. The spray plate 264 of the shower head 260 may be an upper electrode configured to generate plasma. The lower electrode 263 may be embedded in the support plate 212.

The first power supplier 277 may be configured to supply, to the spray plate 264, source power for generating plasma. A second power supplier 279 may be configured to supply, to the lower electrode 263, bias power for accelerating radicals included in plasma. According to one or more example embodiments, a frequency of a voltage or a current of power supplied by each of the first and second power suppliers 277 and 279 may be in a radio frequency (RF) range.

In one or more example embodiments, the second power supplier 279 may be omitted, and the first power supplier 277 may be configured to supply both the source power and the bias power to the upper electrode. In one or more example embodiments, the first power supplier 277 may be omitted, and the second power supplier 279 may be configured to supply both the source power and the bias power to the lower electrode 263.

The substrate processing apparatus 200*a* may generate plasma in the first space 202 by using the power supplied by the first and second power suppliers 277 and 279 and the reaction gas supplied by the gas supply member 240. In addition, the substrate processing apparatus 200*a* may harden the photoresist pattern PRP coated on the substrate S, by using the radicals which have passed through the filter part 284. According to one or more example embodiments, the hardening of the photoresist pattern PRP may refer to removing an organic material in the photoresist pattern PRP.

Figure 7:
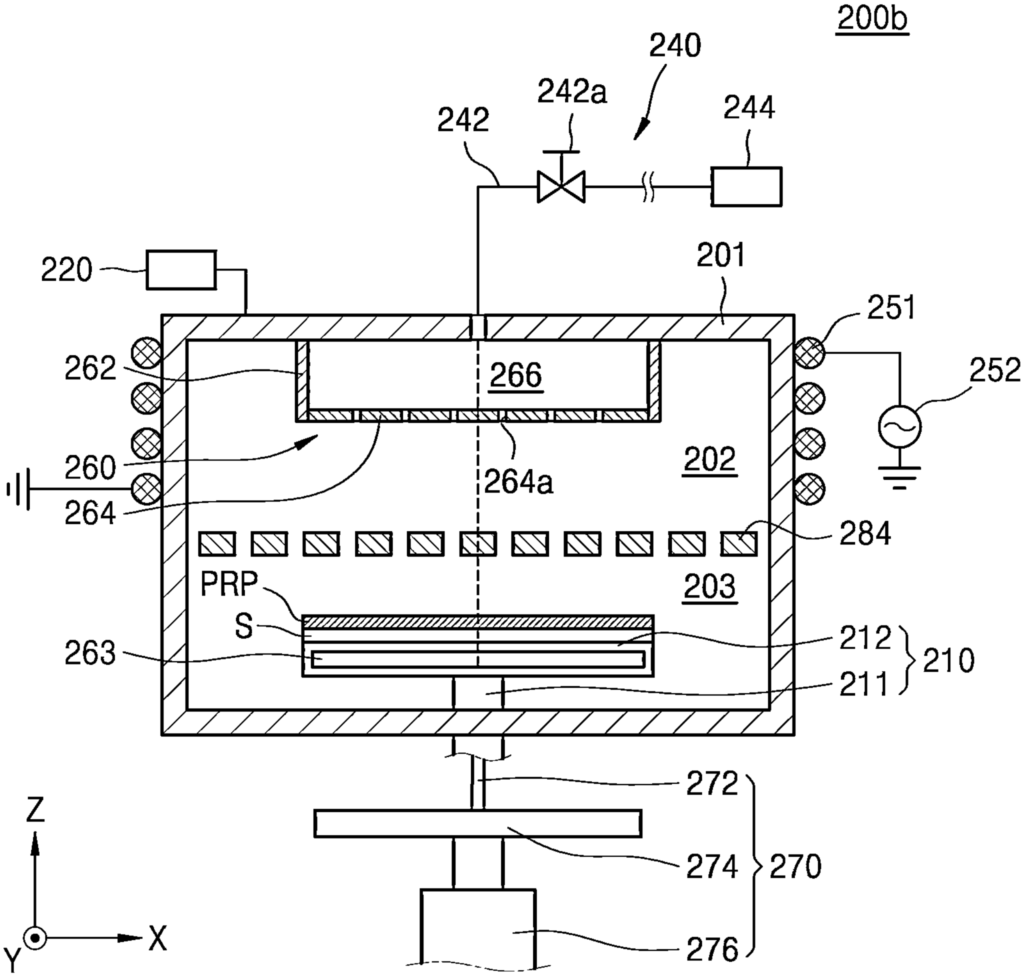
FIG. 7 is a cross-sectional view schematically illustrating an example of a substrate processing apparatus for performing a semiconductor process on a substrate, according to one or more example embodiments.

FIG. 7 is a cross-sectional view schematically illustrating an example of a substrate processing apparatus 200*b* for performing a semiconductor process on a substrate S, according to one or more example embodiments. A description made above with reference to one or more example embodiments shown in FIGS. 2, 3, 4, 5 and 6 is simply repeated or omitted, and differences from the description are mainly described. In one or more example embodiments, a plasma processing apparatus, using the substrate S as an example of a plasma processing target, and inductively coupling plasma (ICP) as a plasma source, may be provided.

Referring to one or more example embodiments shown in FIG. 7, the substrate processing apparatus 200*b* may include a coil 251 and a power supplier 252. Unlike the substrate processing apparatus 200*a* of FIG. 6, the first and second power suppliers 277 and 279 may be omitted. The coil 251 may surround a side wall of the chamber 201. The power supplier 252 may supply power to the coil 251. According to one or more example embodiments, a frequency of a voltage or a current of the power supplied by the power supplier 252 may be in an RF range.

The substrate processing apparatus 200*b* may generate plasma in the first space 202 by using the power supplied by the power supplier 252 and the reaction gas supplied by the gas supply member 240. In addition, the substrate processing apparatus 200*b* may harden the photoresist pattern PRP coated on the substrate S, by using the radicals which have passed through the filter part 284. According to one or more example embodiments, the hardening the photoresist pattern PRP may refer to removing an organic material in the photoresist pattern PRP.

Figure 8:
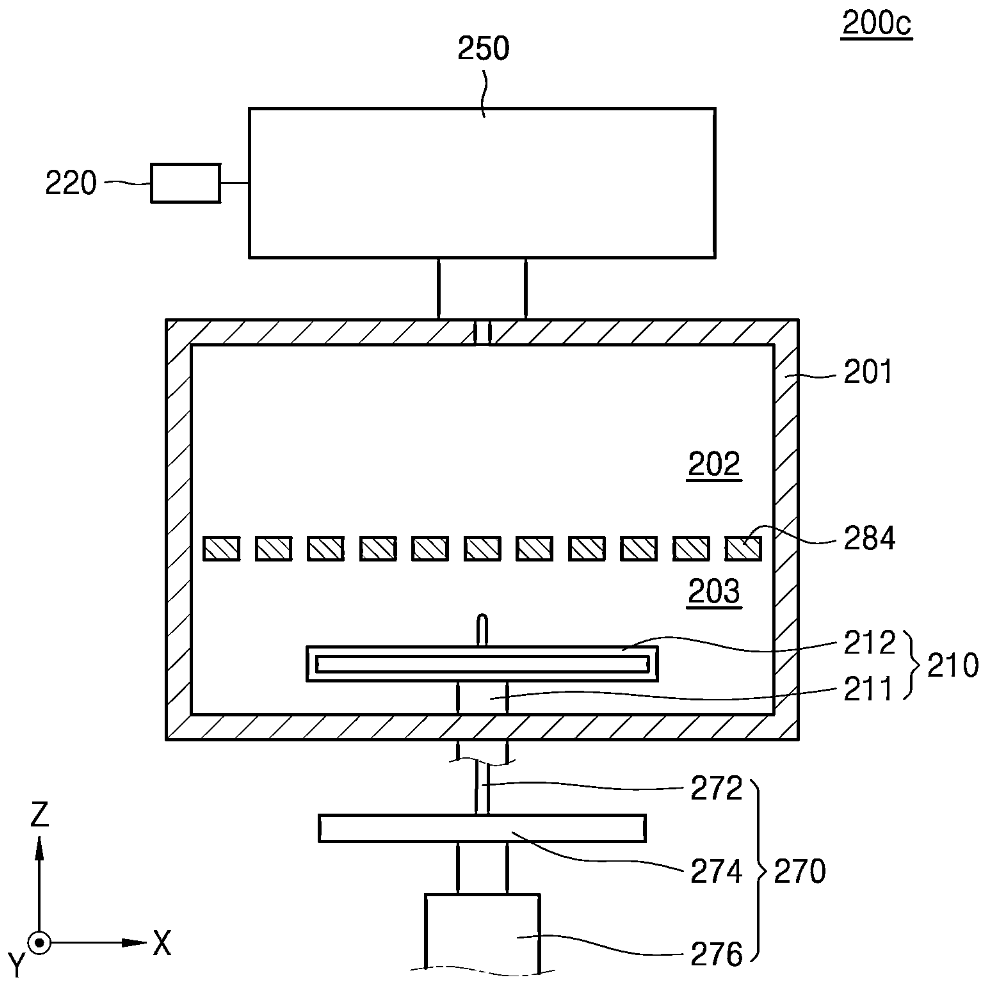
FIG. 8 is a cross-sectional view schematically illustrating an example of a substrate processing apparatus for performing a semiconductor process on a substrate, according to one or more example embodiments.

FIG. 8 is a cross-sectional view schematically illustrating an example of a substrate processing apparatus 200*c* for performing a semiconductor process on a substrate, according to one or more example embodiments.

Referring to the one or more example embodiments shown in FIG. 8, the substrate processing apparatus 200*c* may include a plasma generator 250. The plasma generator 250 may be spaced apart from the chamber 201. For example, as shown in FIG. 8, the plasma generator 250 may be spaced upward from the chamber 201. The plasma generator 250 may include a remote plasma source (RPS).

The plasma generator 250 may generate plasma in a manner similar to the substrate processing apparatus 200*a* of the one or more example embodiments shown in FIG. 6, or the substrate processing apparatus 200*b* of the one or more example embodiments shown in FIG. 7. For example, CCP or ICP may be generated. The plasma generator 250 may include a component configured to supply power to the plasma generator 250 and a component configured to supply gas to the plasma generator 250. The components described above may correspond to the components described with reference to one or more example embodiments shown in FIGS. 6 and 7.

The plasma generated by the plasma generator 250 may be filtered by the chamber 201. For example, the filter part 284 may block ions of the plasma and pass therethrough only radicals of the plasma from the first space 202 to the second space 203. According to one or more example embodiments, the controller 220 may control the plasma generator 250. The substrate processing apparatus 200*c* may harden the photoresist pattern PRP coated on the substrate, by using the radicals.

FIGS. 9A, 9B, 9C, 10A, 10B, 10C, 11A and 11B are top views schematically illustrating substrate processing systems according to one or more example embodiments.

Figure 9A:
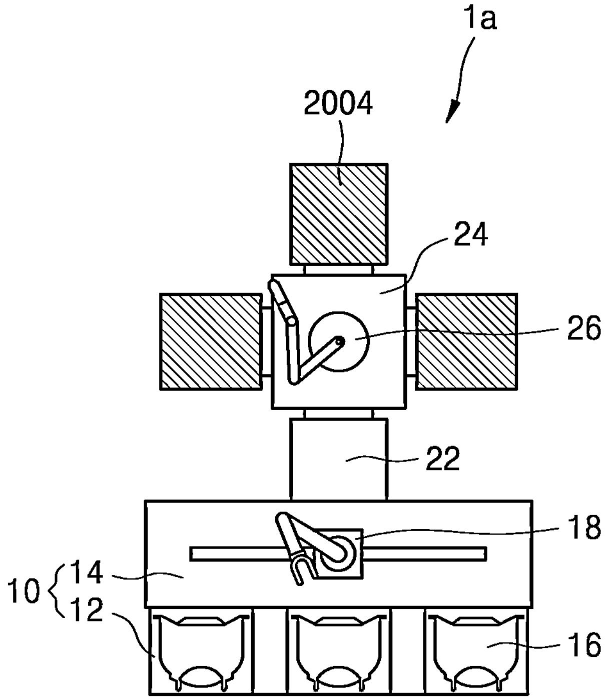
FIGS. 9A, 9B, 9C, 10A, 10B, 10C, 11A and 11B are top views schematically illustrating substrate processing systems according to one or more example embodiments.
Figure 9B:
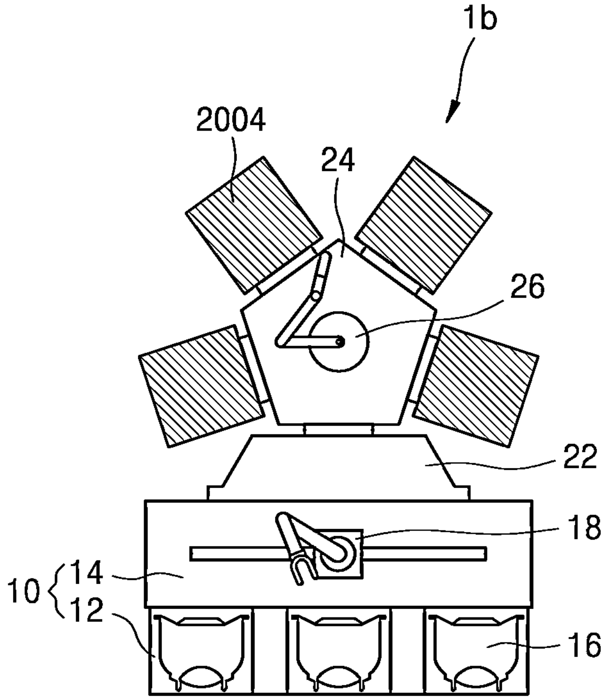
Figure 9C:
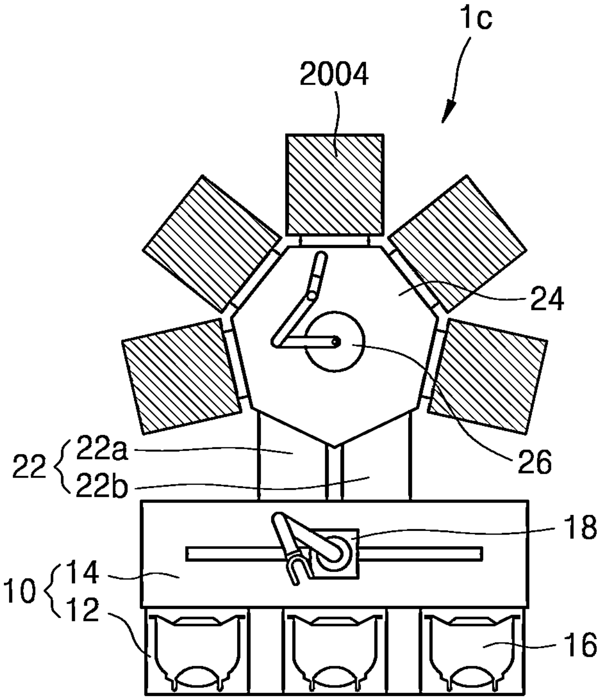

FIGS. 9A, 9B, and 9C illustrate substrate processing systems 1*a*, 1*b*, and 1*c*, respectively, according to one or more example embodiments. Referring to one or more example embodiments shown in FIG. 9A, a process chamber of the substrate processing system 1*a* may be a fourth process chamber 2004. The substrate processing system 1*a* may include a plurality of fourth process chamber 2004. In one or more example embodiments, the substrate processing system 1*a* may include three fourth process chambers 2004. The fourth process chamber 2004 may be the same as the substrate processing apparatus 200 of FIG. 2. According to one or more example embodiments, a cross-sectional view of the transfer chamber 24 may be rectangular.

Referring to one or more example embodiments shown in FIG. 9B, the substrate processing system 1*b* may include a plurality of fourth process chambers 2004. In one or more example embodiments, the substrate processing system 1*b* may include four fourth process chambers 2004. According to one or more example embodiments, a cross-sectional view of the transfer chamber 24 may be pentagonal.

Referring to FIG. 9C, the substrate processing system 1*c* may include a plurality of fourth process chambers 2004. In one or more example embodiments, the substrate processing system 1*c* may include five fourth process chambers 2004. According to one or more example embodiments, a cross-sectional view of the transfer chamber 24 may be heptagonal.

The fourth process chamber 2004 in FIGS. 9A, 9B, and 9C may perform a hardening process of hardening the substrate S on which a cleaning process has been performed. Particularly, the hardening process may refer to a process of hardening the photoresist pattern PRP (see FIG. 2) coated on the substrate S (see FIG. 2), by using UV light or radicals of plasma. In addition, hardening may refer to removing an organic material among metal oxide and the organic material included in the photoresist pattern PRP.

Figure 10A:
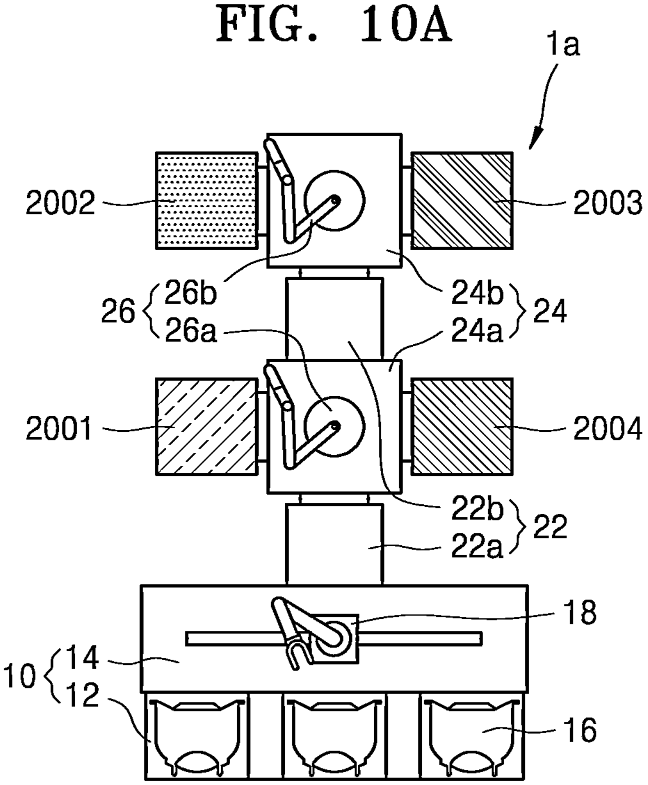
Figure 10B:
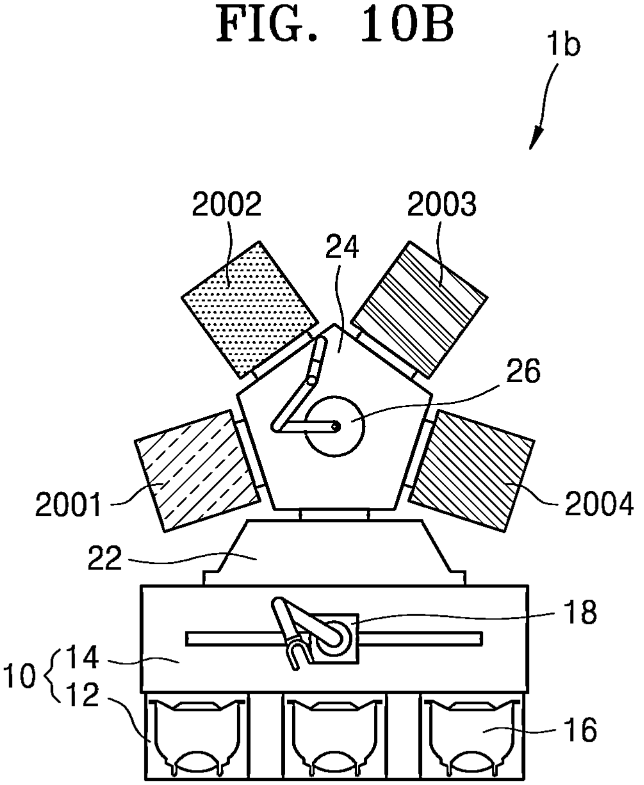
Figure 10C:
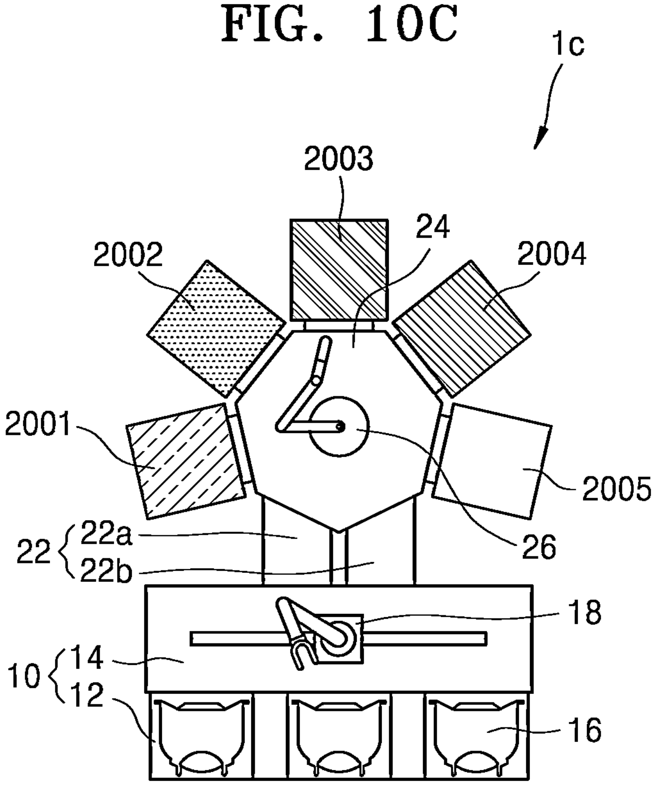

FIGS. 10A, 10B, and 10C illustrate substrate processing systems 1*a*, 1*b*, and 1*c* according to one or more example embodiments, respectively.

Referring to one or more example embodiments shown in FIG. 10A, the substrate processing system 1*a* may include a first process chamber 2001, a second process chamber 2002, a third process chamber 2003, and a fourth process chamber 2004. Throughout the disclosure, the expression "at least one of the first process chamber 2001, the second process chamber 2002, the third process chamber 2003 and the fourth process chamber 2004" indicates not only each of the first process chamber 2001, the second process chamber 2002, the third process chamber 2003 and the fourth process chamber 2004 but also variations thereof. For example, these variations can be both the first process chamber 2001 and the second process chamber 2002, the first process chamber 2001, the second process chamber 2002 and the third process chamber 2003, and all of the first process chamber 2001, the second process chamber 2002, the third process chamber 2003 and the fourth process chamber 2004. The substrate processing system 1*a* may include a plurality of transfer chambers 24. For example, the plurality of transfer chambers 24 may include a first transfer chamber 24*a* and a second transfer chamber 24*b*. The first transfer chamber 24*a* and the second transfer chamber 24*b* may be vertically stacked with the second loadlock chamber 22*b* therebetween. The first transfer chamber 24*a* may be provided beneath the second loadlock chamber 22*b*, and the second transfer chamber 24*b* may be provided on the second loadlock chamber 22*b*. The first loadlock chamber 22*a* may be provided beneath the first transfer chamber 24*a*.

According to one or more example embodiments, a first transportation robot 26*a* of the first transfer chamber 24*a* may transport the substrate S (see FIG. 2) from the first loadlock chamber 22*a* to the first process chamber 2001. After a deposition process in the first process chamber 2001 is finished, the first transportation robot 26*a* may transport the substrate S from the first process chamber 2001 to the second process chamber 2002. After a development process in the second process chamber 2002 is finished, the first transportation robot 26*a* may deliver the substrate S from the second process chamber 2002 to a second transportation robot 26*b*. The second transportation robot 26*b* may load the substrate S to the third process chamber 2003. After a cleaning process in the third process chamber 2003 is finished, the second transportation robot 26*b* may transport the substrate S from the third process chamber 2003 to the fourth process chamber 2004. That is, the substrate S may be sequentially loaded to the first process chamber 2001, then to the second process chamber 2002, then to the third process chamber 2003, and then to the fourth process chamber 2004.

The first process chamber 2001 and the second process chamber 2002 may be at opposite sides of the first transfer chamber 24*a*. In addition, the third process chamber 2003 and the fourth process chamber 2004 may be at opposite sides of the second transfer chamber 24*b*. The first transfer chamber 24*a* and the second transfer chamber 24*b* may include the first transportation robot 26*a* and the second transportation robot 26*b*, respectively. According to one or more example embodiments, cross-sectional views of the first transfer chamber 24*a* and the second transfer chamber 24*b* may be rectangular or square.

Referring to one or more example embodiments shown in FIG. 10B, the substrate processing system 1*b* may include the first process chamber 2001, the second process chamber 2002, the third process chamber 2003, and the fourth process chamber 2004. The substrate S (see FIG. 2) may be sequentially loaded to the first process chamber 2001, then to the second process chamber 2002, then to the third process chamber 2003, and then to the fourth process chamber 2004, and a deposition process, a development process, a cleaning process, and a hardening process, respectively, may be sequentially performed on the substrate S. According to one or more example embodiments, the transfer chamber 24 may have a pentagonal shape.

Referring to one or more example embodiments shown in FIG. 10C, the substrate processing system 1*c* may include the first process chamber 2001, the second process chamber 2002, the third process chamber 2003, the fourth process chamber 2004, and a fifth process chamber 2005. The substrate S may be sequentially loaded to the first process chamber 2001, then to the second process chamber 2002, then to the third process chamber 2003, and then to the fourth process chamber 2004, and a loading order to the fifth process chamber 2005 may depend on a process to be performed in the fifth process chamber 2005.

In the fifth process chamber 2005, any one of the processes performed in the first, second, third and fourth process chambers 2001, 2002, 2003 and 2004 may be performed. For example, the process to be performed in the fifth process chamber 2005 may be the temporally longest process among the processes performed in the first, second, third and fourth process chambers 2001, 2002, 2003 and 2004. In the fifth process chamber 2005, any one of a deposition process, a development process, a cleaning process, and a hardening process may be performed. For example, if a deposition process is performed in the fifth process chamber 2005, a loading order of the substrate S to process chambers may be the first process chamber 2001, then the fifth process chamber 2005, then the second process chamber 2002, then the third process chamber 2003, and then the fourth process chamber 2004.

Figure 11A:
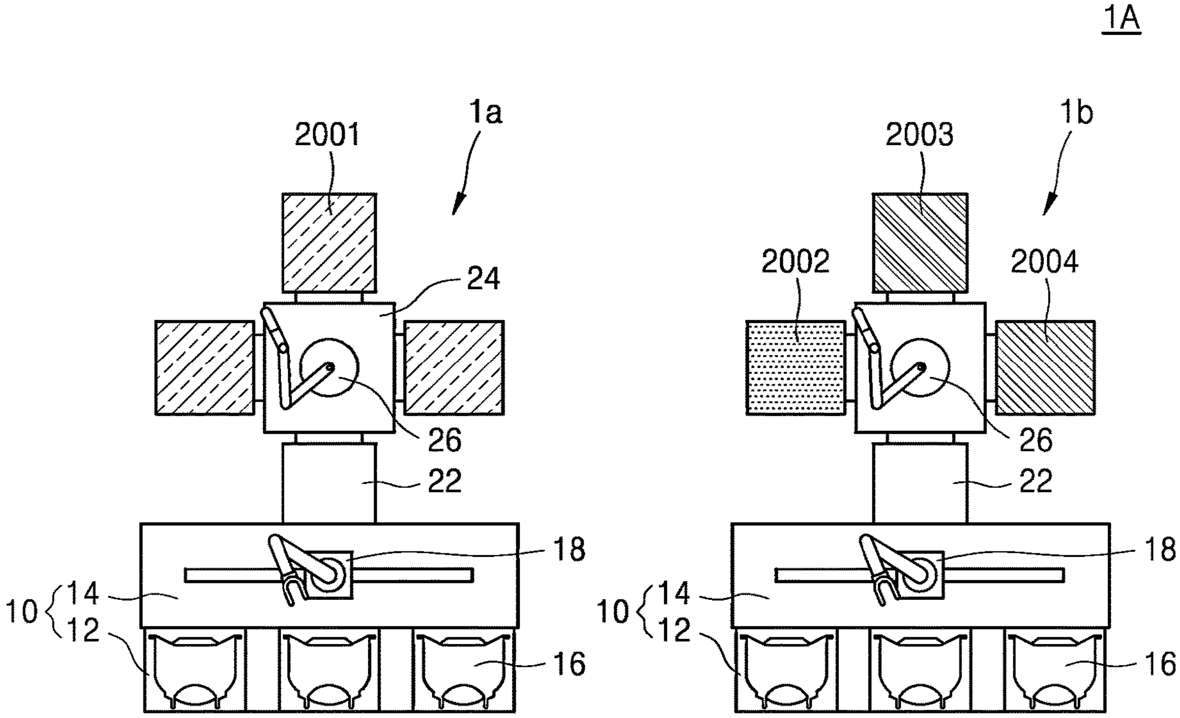
Figure 11B:
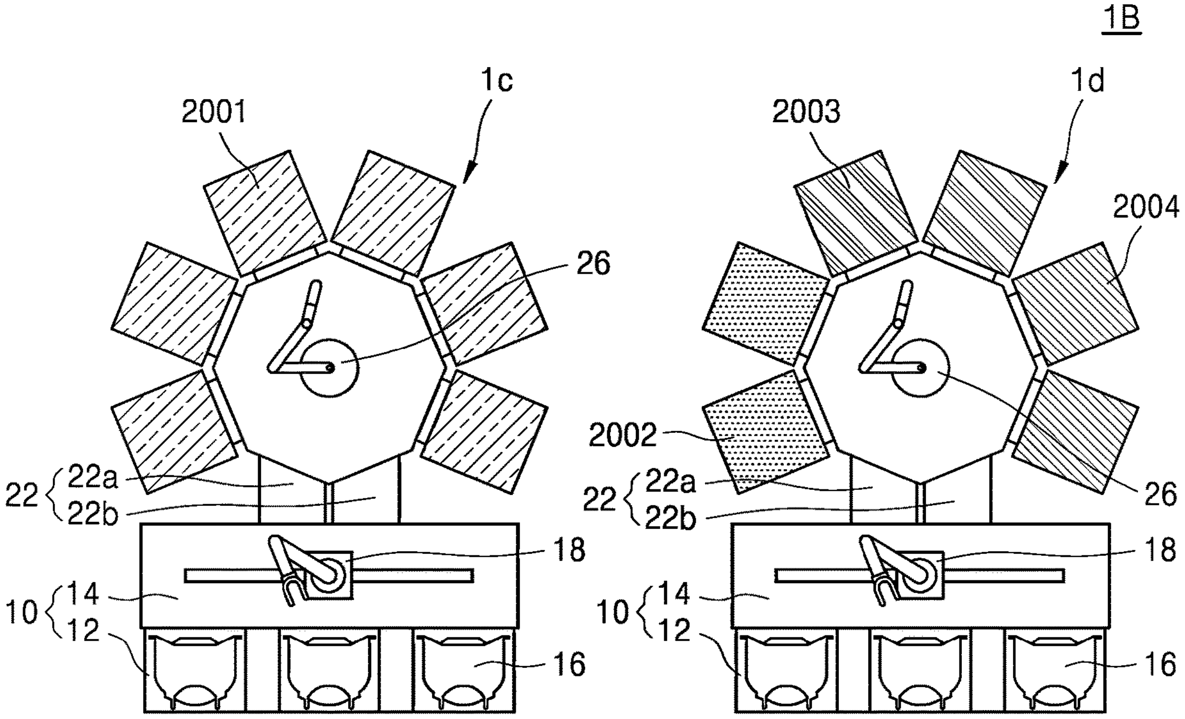

FIGS. 11A and 11B illustrate substrate processing systems 1A and 1B according to one or more example embodiments, respectively.

Referring to one or more example embodiments shown in FIG. 11A, the substrate processing system 1A may include a first substrate processing system 1*a* and a second substrate processing system 1*b*. The substrate processing system 1A may first perform a deposition process in the first substrate processing system 1*a* and then perform a development process, a cleaning process, and a hardening process, in the second substrate processing system 1*b*.

The first substrate processing system 1*a* may include a plurality of first process chambers 2001. For example, the first substrate processing system 1*a* may include three first process chambers 2001. The first substrate processing system 1*a* may perform a deposition process only. According to one or more example embodiments, a cross-sectional view of the transfer chamber 24 may be rectangular. The second substrate processing system 1*b* may include the second process chamber 2002, the third process chamber 2003, and the fourth process chamber 2004. According to one or more example embodiments, a cross-sectional view of the transfer chamber 24 may be rectangular.

Referring to one or more example embodiments shown in FIG. 11B, the substrate processing system 1B may include a first substrate processing system 1*c* and a second substrate processing system 1*d*. A deposition process may be performed in the first substrate processing system 1*c*, and a development process, a cleaning process, and a hardening process, may be performed in the second substrate processing system 1*d*.

The first substrate processing system 1*c* may include a plurality of first process chambers 2001. For example, the first substrate processing system 1*c* may include six first process chambers 2001. According to one or more example embodiments, a cross-sectional view of the transfer chamber 24 may be octagonal.

The second substrate processing system 1*d* may include a plurality of second process chambers 2002, a plurality of third process chambers 2003, and a plurality of fourth process chambers 2004. For example, two second process chambers 2002, two third process chambers 2003, and two fourth process chambers 2004 may be provided. According to one or more example embodiments, a cross-sectional view of the transfer chamber 24 may be octagonal.

The substrate processing system 1B includes more process chambers than the substrate processing system TA and, thus, performs processes on a relatively greater number of substrates S at the same time. That is, the substrate processing system 1B may more efficiently perform a semiconductor process on the substrate S than the substrate processing system TA.

Figure 12:
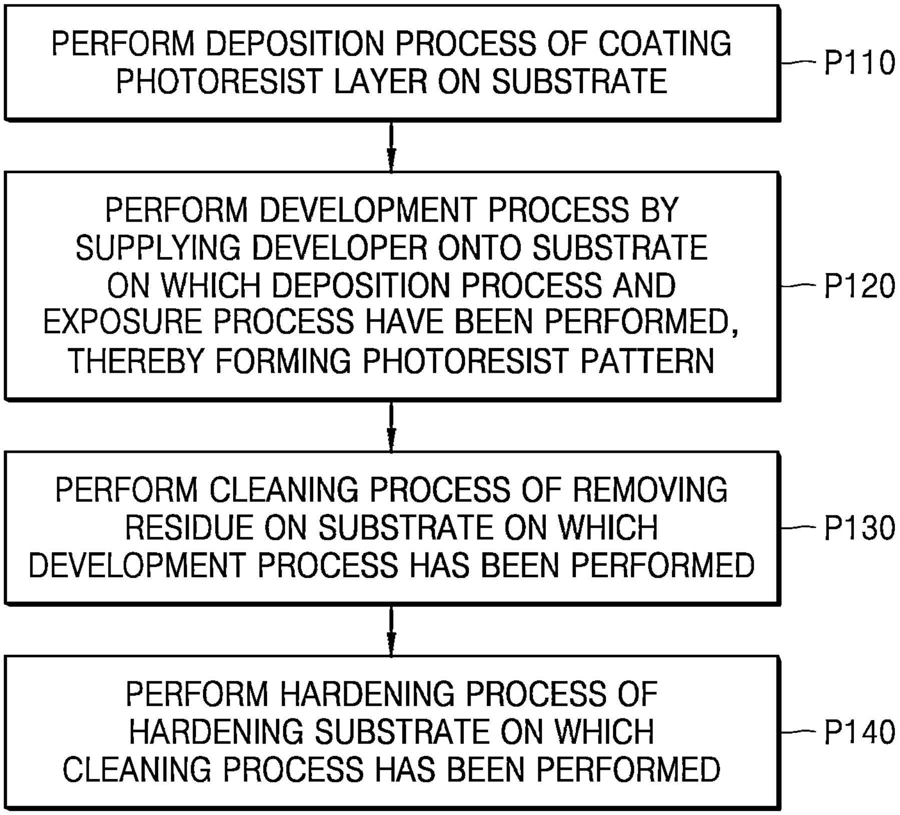
FIG. 12 is a flowchart illustrating a substrate processing method according to one or more example embodiments.

FIG. 12 is a flowchart illustrating a substrate processing method according to one or more example embodiments.

Referring to FIGS. 10B and 12, in operation P110, a deposition process of coating a photoresist layer on the substrate S may be performed. The deposition process may be performed in the first process chamber 2001.

The deposition process of the photoresist layer may include any one of chemical vapor deposition (CVD), physical vapor deposition (PVD), and spin coating. The photoresist layer may be a photoresist layer for extreme ultraviolet (EUV) light. Because the number of photons after exposure in an EUV exposure process is less than the number of photons after exposure in a DUV exposure process or the like, the use of a material having a high EUV absorption rate is advantageous.

According to one or more example embodiments, a thickness of the photoresist layer may be in a range of about 0.1 μm to about 2 μm. According to one or more example embodiments, the thickness of the photoresist layer may be in a range of about 200 nm to about 600 nm. The photoresist layer for EUV light may be made thin by spin-coating a photoresist solution of a dilute concentration on the substrate S.

In one or more example embodiments, the photoresist layer may include an inorganic material, including, but not limited to tin oxide ($SnO_2$). For example, the photoresist layer may include, but is not limited to, an $SnO_2$-based resist, a titanium oxide ($TiO_2$)-based resist, a zirconium oxide ($ZrO_2$)-based resist, a tantalum oxide ($Ta_2O_5$)-based resist, or a hafnium oxide ($HfO_2$)-based resist. According to one or more example embodiments, even when the photoresist layer is removed through a strip process after finishing a lithography process and a subsequent process, the inorganic material may remain at a concentration of about $1*10^{11}/cm^3$ or less in an underlayer of the photoresist layer. When the photoresist layer includes an inorganic material, it is easy to make the photoresist layer thin, and etching selectivity is high, and thus, a thin hard mask may be formed beneath the photoresist layer in an etching process.

When a thickness of a layer to be etched is large, a hard mask layer including amorphous carbons may be further provided beneath the photoresist layer. According to one or more example embodiments, the hard mask layer may further include fluorine. When the hard mask layer includes fluorine, the EUV sensitivity of the photoresist layer may be improved. In addition, an anti-reflective layer may be further provided between the hard mask layer and the photoresist layer.

In operation P120, a development process may be performed on the substrate S by supplying a developer onto the substrate S on which the deposition process and the exposure process have been performed, thereby forming the photoresist pattern PRP. According to one or more example embodiments, the exposure process is a process of partially changing the nature of the photoresist layer to form the photoresist pattern PRP for forming a semiconductor circuit.

If the photoresist layer is exposed to light, the photoresist layer photochemically reacts to the light. The photoresist layer may be partially exposed to light by a patterning device, including, but not limited to a photomask. By projecting, on the photoresist layer, light having passed through the patterning device, a layer of a circuit pattern constituting a semiconductor device may be transferred to the photoresist layer on the substrate S.

A post exposure bake process may be selectively performed after the exposure process and before the development process. The post exposure bake process may be performed by a bake plate. The post exposure bake process may be a selective process used to induce improvement of the uniformity of the photoresist layer through an additional chemical reaction or spread of a particular component in the photoresist layer.

Thereafter, the development process of removing an exposed portion or a non-exposed portion of the photoresist layer may be performed. The development process may be performed in the second process chamber 2002. The photoresist pattern PRP may be formed by the development process. An EUV resist pattern may be formed by using a developer to partially remove the photoresist layer. In one or more example embodiments, if the photoresist layer is a negative type, a portion of the photoresist layer exposed to light may remain, and a portion of the photoresist layer, which is not exposed to the light, may be removed. In one or more example embodiments, if the photoresist layer is a positive type, the portion of the photoresist layer exposed to the light may be removed, and the portion of the photoresist layer, which is not exposed to the light, may remain. After the development process, residue may remain on the substrate S and the EUV resist pattern. The residue may include the developer, water, and/or an organic solvent. According to one or more example embodiments, the photoresist pattern PRP may include metal oxide and an organic material.

In operation P130, a cleaning process of removing the residue on the substrate S on which the development process has been performed may be performed. The cleaning process may be performed in the third process chamber 2003.

The cleaning process may be a process of removing the residue on the substrate S by using a supercritical fluid. By dissolving the residue in the supercritical fluid and then discharging the supercritical fluid, the residue may be removed together with the supercritical fluid from the substrate S and the photoresist pattern PRP.

In operation P140, a hardening process may be performed of hardening the substrate S on which the cleaning process has been performed. The hardening process may be performed in the fourth process chamber 2004. The hardening process may comprise a process of removing an organic material remaining in the photoresist pattern PRP. The hardening process may comprise a process of hardening the photoresist pattern PRP by emitting UV light thereon or using radicals of plasma. In one or more example embodiments, the hardening process may be performed in a state of heating the substrate S at 400° C. or less. After the hardening process, an etching process of etching the photoresist pattern PRP may be performed.

Figure 13A:
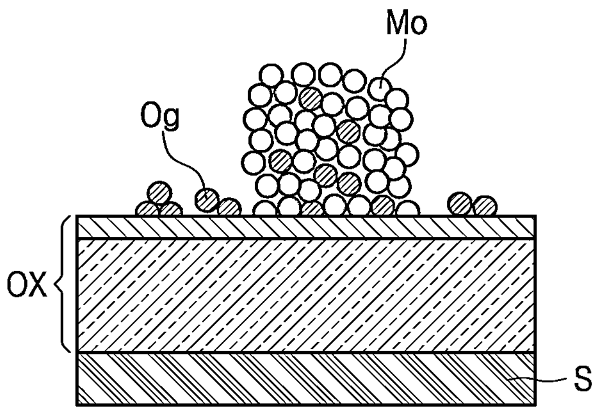
FIGS. 13A and 13B illustrate a substrate processing method according to a comparative example.
Figure 13B:
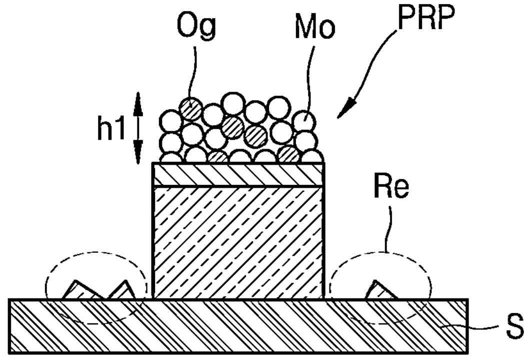

FIGS. 13A and 13B illustrate a substrate processing method according to a comparative example.

FIG. 13A illustrates a comparative photoresist pattern PRP before an etching process. Referring to FIG. 13A, the comparative photoresist pattern PRP (see FIG. 2) may include metal oxide Mo and an organic material Og. The organic material Og is mixed with the metal oxide Mo, and residue of a photoresist layer, which has not reacted to EUV, remains at a portion which is supposed to be removed by exposure. As described above, a fact that the organic material Og, which is supposed to be removed by an exposure process and a development process, remains, is referred to as a single line open (SLO) defect. In addition, the surface of the comparative photoresist pattern PRP is not flat due to the organic material Og mixed with the metal oxide Mo.

FIG. 13B illustrates a result of an etching process on the comparative photoresist pattern PRP on which a hardening process has not been performed. Referring to FIG. 13B, after the etching process, the metal oxide Mo and the organic material Og are included in the comparative photoresist pattern PRP. Oxide to be etched remains as portions marked with dashed lines. As described above, etching is not performed well due to the residue of the photoresist layer, which has not reacted to EUV, as described with reference to FIG. 13A.

Figure 14A:
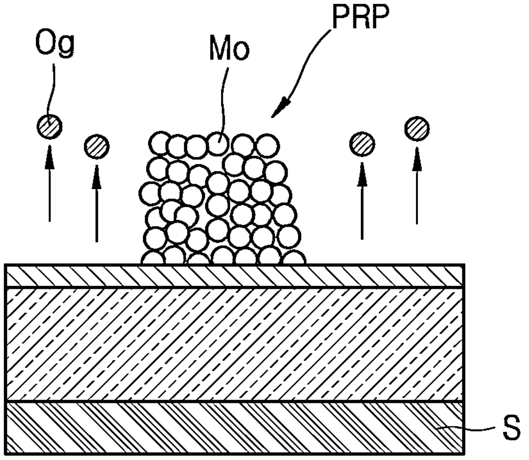
FIGS. 14A and 14B illustrate a substrate processing method according to one or more example embodiments.
Figure 14B:
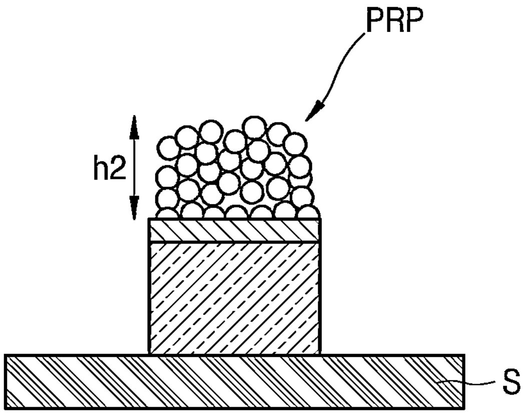

FIGS. 14A and 14B illustrate a substrate processing method according to one or more example embodiments.

FIG. 14A illustrates the photoresist pattern PRP after a hardening process and before an etching process. Referring to FIG. 14A, the organic material Og existing in the photoresist pattern PRP is removed. In addition, an SLO defect is also removed, and a shape of the metal oxide Mo is also changed to be flat. By the hardening process, the photoresist pattern PRP is made relatively thin.

FIG. 14B illustrates a result of an etching process on the photoresist pattern PRP on which the hardening process has been performed. Referring to FIG. 14B, a height h2 of the photoresist pattern PRP of FIG. 14B may be greater than a height h1 of the comparative photoresist pattern PRP of FIG. 13B, and a process margin may be improved. In addition, residue of a photoresist layer, which has not reacted to EUV light, may be removed by the previously performed hardening process, and thus, etching may be more accurately performed.

Figure 15A:
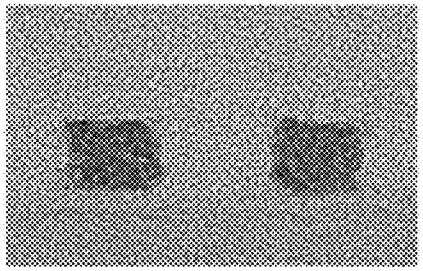
FIGS. 15A and 15B are experiment results illustrating an effect of a substrate processing system according to one or more example embodiments.
Figure 15B:
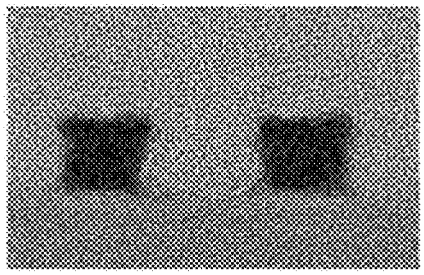

FIGS. 15A and 15B are experimental results illustrating an effect of the substrate processing system 1 according to one or more example embodiments. FIG. 15A illustrates the comparative photoresist pattern PRP on which a hardening process has not been performed. In contrast, FIG. 15B illustrates the photoresist pattern PRP on which a hardening process has been performed.

Referring to FIG. 15A, a height of the comparative photoresist pattern PRP may be about 1 nm, and an angle of a corner of the comparative photoresist pattern PRP may be about 82 degrees. Referring to FIG. 15B, a height of the photoresist pattern PRP on which a hardening process has been performed may be about 1.03 nm, and an angle of a corner of the photoresist pattern PRP may be about 85 degrees, and thus, a profile of the photoresist pattern PRP may be improved.

Figure 16:
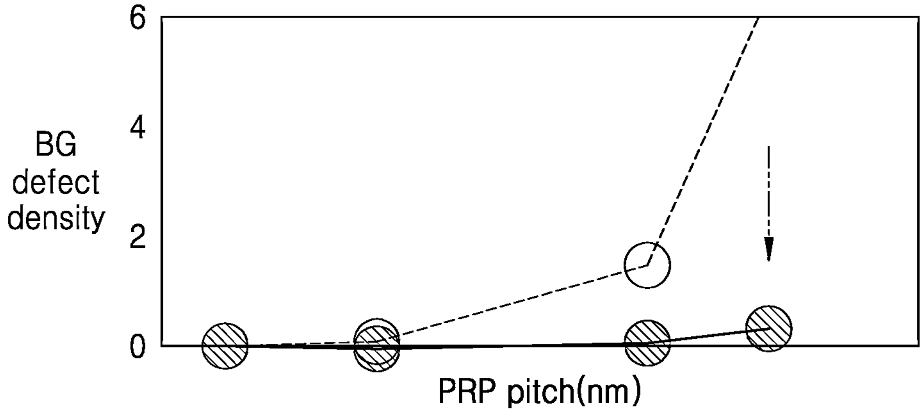
FIG. 16 is a graph illustrating an effect of the substrate processing system according to one or more example embodiments.

FIG. 16 is a graph illustrating the effect of the substrate processing system 1 according to one or more example embodiments.

Referring to FIG. 16, the horizontal axis may refer to a photoresist pattern PRP pitch (unit: nm), and the vertical axis may refer to a metal pattern bridge BG defect density (unit: percentage). A dashed line may refer to the comparative photoresist pattern PRP on which a hardening process has not been performed, and a solid line may refer to the photoresist pattern PRP on which a hardening process has been performed.

A bridge defect of the comparative photoresist pattern PRP on which a hardening process has not been performed sharply increases from a part where a photoresist pattern pitch exceeds one point, whereas a bridge defect of the photoresist pattern PRP on which a hardening process has been performed is remarkably low in the entire region of the photoresist pattern pitch. Accordingly, if a hardening process is performed, a profile of the photoresist pattern PRP may be improved.

While example embodiments have been particularly shown and described above, it will be apparent to those skilled in the art that various changes in form and details may be made therein without departing from the spirit and scope of the following claims.

What is claimed is:

1. A substrate processing system comprising:

a first process chamber configured to perform a deposition process of coating a photoresist layer on a substrate;

a second process chamber configured to perform a process of forming a photoresist pattern from the photoresist layer by supplying a developer onto the substrate on which the deposition process and an exposure process have been performed, and perform a development process on the substrate;

a third process chamber configured to perform a cleaning process of removing residue on the substrate on which the development process has been performed using a supercritical fluid; and a fourth process chamber configured to perform a hardening process of hardening the substrate on which the cleaning process has been performed, wherein the photoresist pattern comprises a metal oxide and an organic material, wherein the hardening process comprises removing the organic material in the photoresist pattern by using radicals of plasma, wherein the hardening process is performed while the substrate is heated to 400° C. or less, and wherein the fourth process chamber comprises a filter part configured to selectively pass only the radicals of the plasma while blocking ions of the plasma.

2. The substrate processing system of claim 1, wherein the fourth process chamber is further configured to form the plasma by one of a capacitively coupled plasma type configuration and an inductively coupled plasma type configuration.

3. The substrate processing system of claim 1, wherein the filter part divides the fourth process chamber into a first space in which the plasma is formed and a second space in which the substrate is provided, and wherein the filter part is configured to allow radicals of the plasma to pass from the first space, through the filter part, and then to the second space.

4. The substrate processing system of claim 1, further comprising a plasma generator spaced apart from the fourth process chamber and configured to generate plasma, wherein the photoresist pattern on the substrate is hardened by the plasma generated by the plasma generator.

5. The substrate processing system of claim 1, further comprising a fifth process chamber configured to perform one of: the deposition process, the exposure process, the development process, or the hardening process is performed.

6. The substrate processing system of claim 1, further comprising a transportation robot configured to load the substrate to or unload the substrate from at least one of the first process chamber, the second process chamber, the third process chamber, or the fourth process chamber.

7. A substrate processing method comprising:

performing a deposition process of coating a photoresist layer on a substrate;

forming a photoresist pattern by supplying a developer onto the substrate on which the deposition process and an exposure process have been performed, and performing a development process;

performing a cleaning process of removing residue on the substrate on which the development process has been performed using a supercritical fluid; and performing a hardening process of hardening the substrate on which the cleaning process has been performed, wherein, before the hardening process, the photoresist pattern comprises a metal oxide and an organic material, wherein the hardening process comprises removing the organic material in the photoresist pattern by using radicals of plasma, wherein the hardening process is performed in a state in which a temperature of the substrate is at 400° C. or less, and wherein the radicals of the plasma are filtered by a filter part configured to selectively pass only the radicals of the plasma while blocking ions of the plasma.

* * * * *